(12) United States Patent
Kawakami (10) Patent No.: US 7,492,193 B2
(45) Date of Patent: Feb. 17, 2009

(54) DRIVER CIRCUIT

(75) Inventor: Kenichi Kawakami, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 156 days.

(21) Appl. No.: 11/325,302

(22) Filed: Jan. 5, 2006

(65) Prior Publication Data

US 2006/0152253 A1 Jul. 13, 2006

(30) Foreign Application Priority Data

Jan. 7, 2005 (JP) ............................ 2005-002941

(51) Int. Cl.
  *H03K 3/00* (2006.01)
(52) U.S. Cl. .................... 327/108; 327/100; 326/82
(58) Field of Classification Search .................. 327/108
See application file for complete search history.

(56) References Cited

U.S. PATENT DOCUMENTS

| | | | | |
|---|---|---|---|---|
| 5,557,223 | A * | 9/1996 | Kuo ............................ | 327/108 |
| 5,999,041 | A * | 12/1999 | Nagata et al. ............... | 327/538 |
| 6,639,425 | B2 * | 10/2003 | Yazdy ......................... | 326/82 |

FOREIGN PATENT DOCUMENTS

| | | |
|---|---|---|
| JP | 4-79416 | 3/1992 |
| JP | 5-252020 | 9/1993 |
| JP | 2000-278053 | 10/2000 |
| JP | 2000-341107 | 12/2000 |
| JP | 2001-94354 | 4/2001 |
| JP | 2003-249966 | 9/2003 |

OTHER PUBLICATIONS

Japanese Office Action dated Oct. 16, 2007 with partial English translation.

* cited by examiner

*Primary Examiner*—Quan Tra
*Assistant Examiner*—Khareem E. Almo
(74) *Attorney, Agent, or Firm*—McGinn IP Law Group, PLLC (57) ABSTRACT

A driver circuit that prevents amplitude reduction at a high temperature comprises a differential pre-buffer circuit 22 for performing signal clamping by diodes 16 and 17 each having a nonlinear voltage-current characteristic with respect to an input signal and a differential output circuit 23 for amplifying output signals of the differential pre-buffer circuit 22, for output. The driver circuit further includes a temperature characteristic compensation circuit 44 for controlling direct currents to be passed through the diodes 16 and 17 based on a current to be passed through a diode 43 having a voltage-current characteristic with the same temperature coefficient as those of the diodes 16 and 17. A current related to constant currents I1 and I2 is supplied from the temperature characteristic compensation circuit 44 as a current that cancels the temperature characteristic of a fall in forward voltages of the diodes 16 and 17.

14 Claims, 9 Drawing Sheets

DRIVER CIRCUIT

FIELD OF THE INVENTION

The present invention relates to a driver circuit. More specifically, the invention relates to a driver circuit having a temperature compensating function.

BACKGROUND OF THE INVENTION

Output characteristics of a circuit for high-speed communication such as the one through USB (Universal Serial Bus) 2.0 are defined by extremely strict specifications. The USB 2.0 is present is a personal computer interface specification for connecting a peripheral device. A result of an individual design product is evaluated by conducting a certification test and judging whether its characteristics conform to a specification by a specific organization. Characteristics of semiconductor integrated circuits vary according to process variations, a temperature variation, or a supply voltage variation. Thus, it is not so easy to satisfy the specifications under all requirements. In recent years, semiconductors of higher-speed, larger-size, and higher power consumption have become popular, and a junction temperature of the semiconductors greatly changes according to an operation state of the semiconductors. Accordingly, the driver circuit is particularly desired which sufficiently satisfies the specifications even if a large temperature variation would occur.

Figure 5:
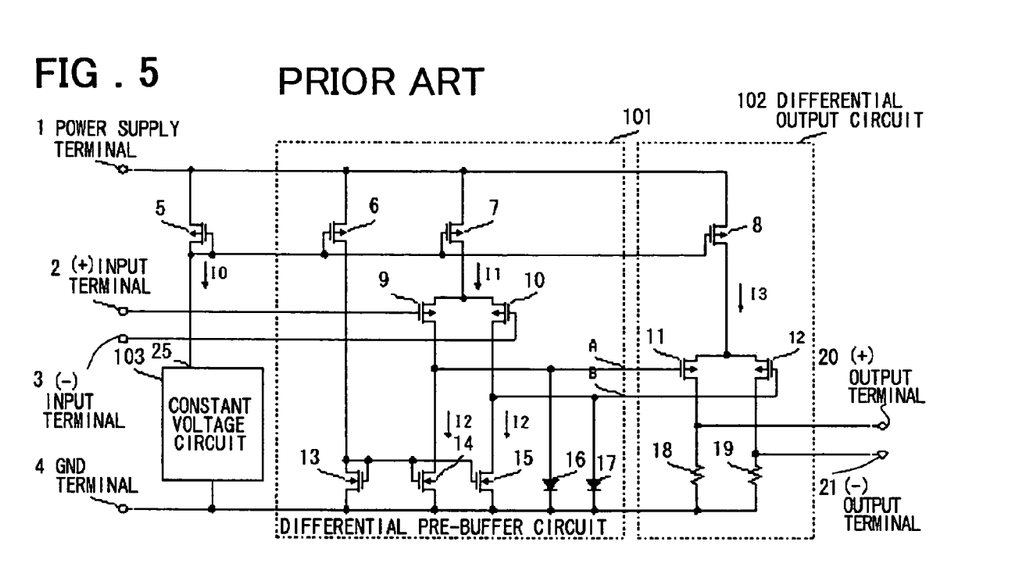
FIG. 5 is a circuit diagram analyzed on a conventional driver circuit.

FIG. 5 is a circuit diagram of a driver circuit of a conventional art. Referring to FIG. 5, the driver circuit includes a differential pre-buffer circuit 101, a differential output circuit 102, and a constant current circuit 103. Reference numeral 1 denotes a power supply terminal. Reference numeral 2 denotes a non-inverted input terminal (+), reference numeral 3 denotes an inverted input terminal (−), reference numeral 4 denotes a GND terminal, reference numerals 5 to 12 denote P-ch MOS transistors, reference numerals 13 to 15 denote N-ch MOS transistors, reference numerals 16 and 17 denote diodes, reference numerals 18 and 19 denote terminating resistances for outputs, reference numeral 20 denotes a non-inverted output terminal (+), and reference numeral 21 denotes an inverted output terminal (−).

Figure 6:
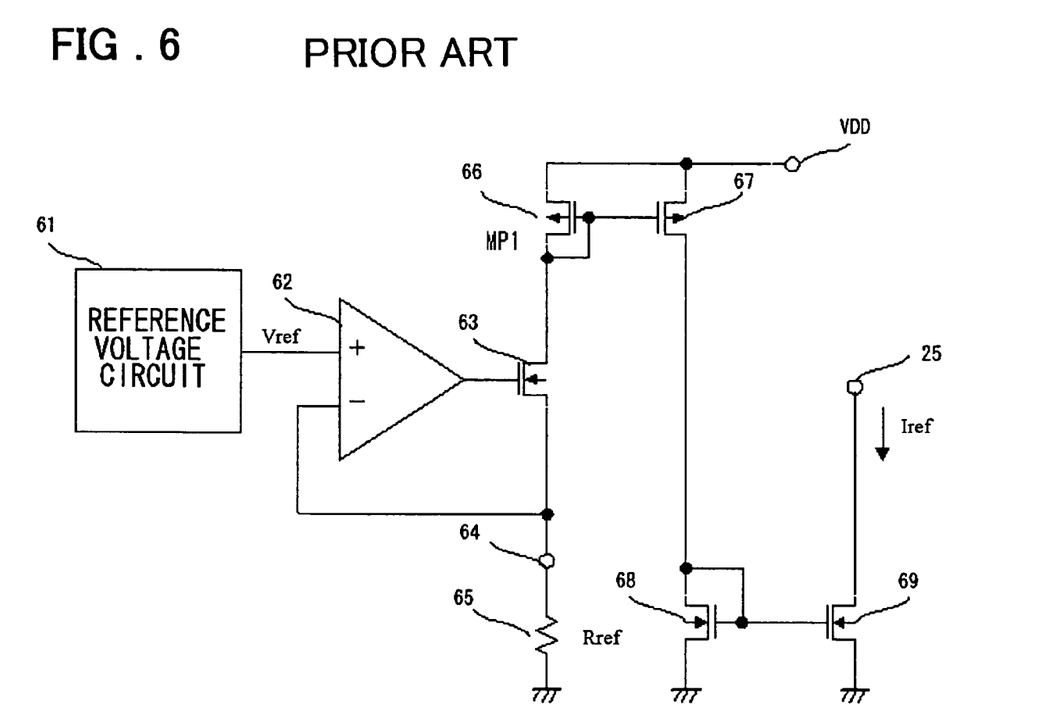
FIG. 6 is a circuit diagram analyzed on a constant current circuit used in the conventional driver circuit.

The constant current circuit 103 has a configuration as shown in FIG. 6. Referring to FIG. 6, a reference voltage circuit 61 is a stable reference voltage source such as a band gap regulator, and supplies a stable voltage to a non-inverted input terminal of an operational amplifier 62. An output terminal of the operational amplifier 62 is connected to a gate of an N-ch MOS transistor 63 in an output stage. A source of the N-ch MOS transistor 63 is connected to a voltage output terminal 64 and an inverted input terminal of the operational amplifier 62. Between the voltage output terminal 64 and a GND (for grounding), an external resistance 65 for an LSI is connected. A drain of the N-ch MOS transistor 63 in the output stage is connected to an input side of a current mirror circuit constituted from P-ch MOS transistors 66 and 67. An output of the current mirror is input to a current mirror constituted from N-ch MOs transistors 68 and 69. From a current output terminal 25 connected to a drain of an N-ch MOs transistor 69, an output current Iref is output.

When an output voltage of the reference voltage circuit 61 is represented by Vref and a value of the external resistance 65 is represented by Rref, an output current Iref from the current output terminal 25 for the current mirror is expressed by Equation (1).

$$Iref = Vref / Rref \quad \text{Equation (1)}$$

When the voltage Vref is set to have small variations and a small temperature variation and when the resistance Rref is set to have neither variations nor temperature variation, both the variations of the current Iref and the temperature variation of the current Iref become extremely small. An output current I0 (Iref) of the constant current circuit 103 is a current of which the variations and the temperature variation are both small. The output current I0 is input to a current mirror circuit constituted from P-ch MOS transistors 5 to 8.

A drain current I1 of the P-ch MOS transistor 7 is the current from a constant current source for P-ch MOS transistors 9 and 10 in the differential stage of a differential pre-buffer circuit 101. A drain of the P-ch MOS transistor 6 is connected to an input side of a current mirror constituted from the N-ch MOS transistors 13 to 15. Drains of the N-ch MOS transistors 14 and 15 are connected to drains of the P-ch MOS transistors 9 and 10, respectively. Further, the drains of the N-ch MOS transistors 14 and 15 are connected to anodes of diodes 16 and 17, respectively, and are also connected to points A and B, respectively, which become output terminals of the differential pre-buffer circuit 101. When drain currents of the N-ch CMOS transistors 14 and 15 are set to be equal and the value of the currents is represented by I2, the currents I1 and I2 both become constant currents of which both of the variations and the temperature variation are small.

The P-ch MOS transistors 11 and 12 in the differential stage of the differential output circuit 102 receives an output current I3 of the P-ch MOS transistor 8, which is an output of the current mirror circuit, as a constant current. The terminating resistance 18 is connected between the output terminal 20 and a GND, and the terminating resistance 19 is connected between the output terminal 21 and the GND. The current I3 is likewise the constant current of which both the variations and the temperature variation are small. Accordingly, when a resistance of which both the variations and the temperature variation are small (such as an external resistance) is employed for the terminating resistances 18 and 19, the variations and temperature variation of amplitudes of outputs of the output terminals 20 and 21 will also become small.

Figure 7:
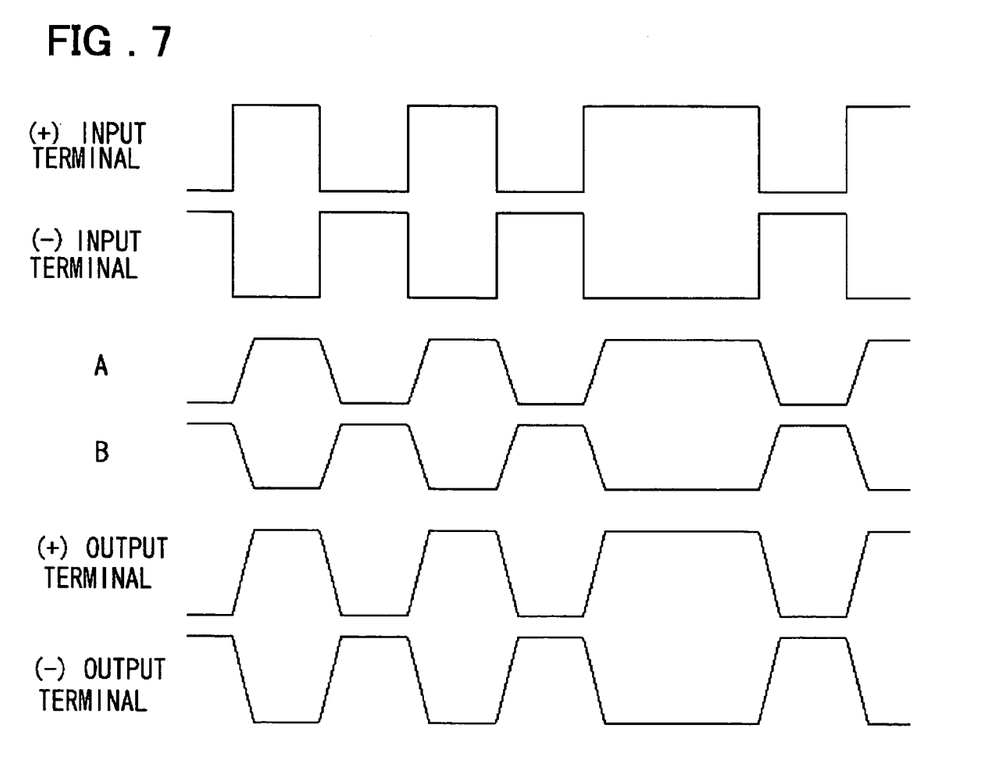
FIG. 7 includes diagrams showing operating waveforms analyzed on respective units of the driver circuit.

FIG. 7 shows operating waveforms of respective points. When input signals that are inverted to each other are supplied to the non-inverted input terminal (+) 2 and the inverted input terminal (−) 3, signals with the waveforms thereof as shown in FIG. 7 are output from the points A and B, at which outputs of the differential pre-buffer circuit 101 appear, and the non-inverted output terminal (+) 20 and the inverted output terminal (−) 21 of the differential output circuit 102.

Figure 8:
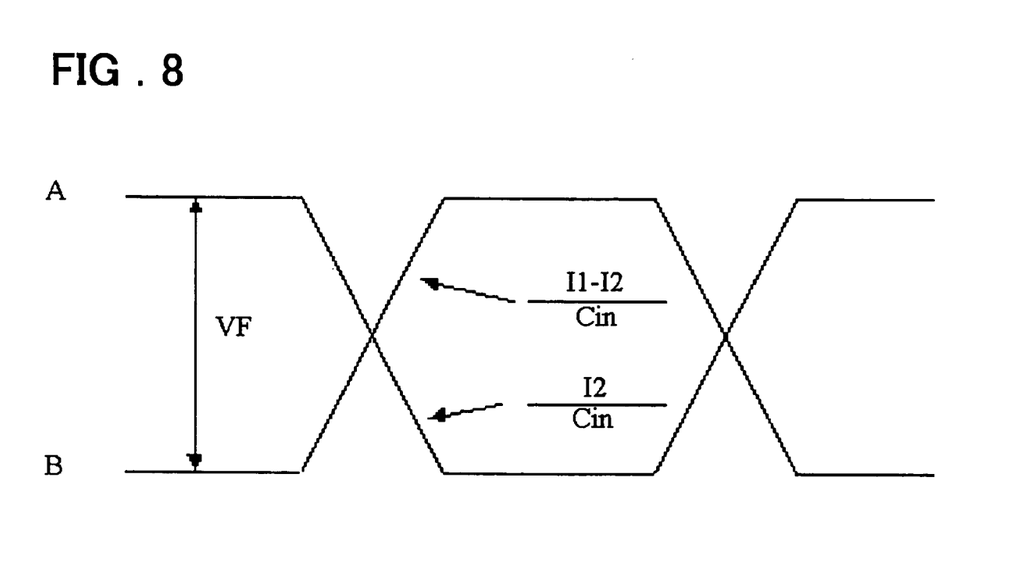
FIG. 8 is a diagram showing slopes of waveforms analyzed at points A and B.

When an input capacitance of each of the P-ch MOS transistors 11 and 12 in the differential stage of the differential output circuit is represented by Cin and when this is set to be sufficiently larger than other parasitic capacitance, a rise time and a fall time at the points (nodes) B and A are expressed by Equations (2) and (3), respectively, as shown in FIG. 8:

$$\text{Rise Time} = (I1 - I2)/Cin \quad \text{Equation (2)}$$

$$\text{Fall Time} = I2/Cin \quad \text{Equation (3)}$$

Since the capacitance Cin is the input capacitance of a CMOS transistor, the temperature variation of the capacitance Cin is small. Accordingly, the rise and fall times of the output waveforms at the output terminals 20 and 21 depend on the rise and fall times of outputs A and B of the pre-buffer circuit 101.

Thus, the output waveforms of which the variations and the temperature variation are small can be obtained.

SUMMARY OF THE DISCLOSURE

A requirement for the variations of the output waveforms and the temperature variation of the output waveforms to become small in the conventional art is that the output amplitude of the differential pre-buffer circuit 101 is sufficiently large and that switching (changing-over) of the P-ch MOS transistors 11 and 12 in the differential stage of the differential output circuit 102 is completely performed. An output amplitude VF in FIG. 8, which is the output amplitude of the differential pre-buffer circuit 101 is as large as forward voltages of diodes 16 and 17. A relation between the amplitude VF, the value of the current I1, and the value of the current I2 is given by Equation (4).

$$VF = (k \times T/q) \times \ln\{(I1-I2)/Is\} \quad \text{Equation (4)}$$

in which k indicates the Boltzmann constant, T indicates the absolute temperature, q represents electron charges, and Is indicates the diode forward saturation current. Generally, the amplitude VF has a comparatively large negative temperature coefficient. Accordingly, at a high temperature, the output amplitude of the differential pre-buffer circuit 101 is lowered.

Figure 9:
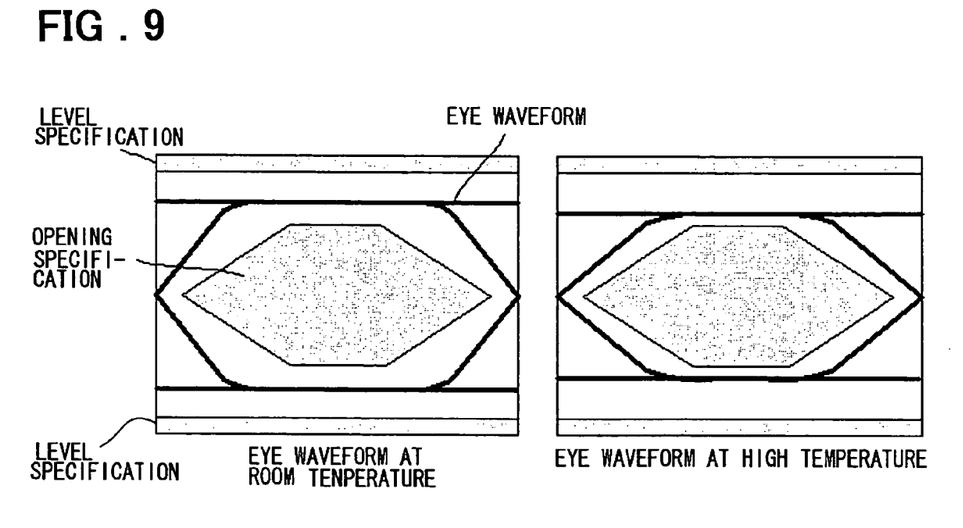
FIG. 9 includes diagrams showing eye waveforms analyzed on an output signal at room temperature and at a high temperature.

FIG. 9 shows eye-shaped (opening) waveforms (termed hereinafter "eye waveform") of an output signal of the differential output circuit 102 observed at room temperature and at high temperature. When an eye waveform reaches (or exceeds) a predetermined level specification (threshold) or a predetermined opening specification (threshold), the eye waveform is rejected in the certification test. At the room temperature, a satisfactory waveform that meets the specifications can be obtained. At the high temperature, however, the amplitude is lowered. Thus, an allowance for the specification, especially the opening specification is eliminated. Then, at worst, the eye waveform may not meet the specification.

In order to solve the problem described above, a driver circuit according to one aspect of the present invention comprises:

a buffer circuit that performs input signal clamping by first semiconductor devices each having a nonlinear voltage-current characteristic, for output; and a temperature compensation circuit that controlls direct currents to be passed through the first semiconductor devices based on a direct current to be passed through a second semiconductor device, the second semiconductor device having a voltage-current characteristic with a same temperature coefficient as temperature coefficients of the first semiconductor devices.

The meritorious effects of the present invention are summarized as follows.

According to the present invention, the temperature variation in the output signal amplitude of the driver circuit can be reduced.

PREFERRED EMBODIMENTS OF THE INVENTION

Figure 1:
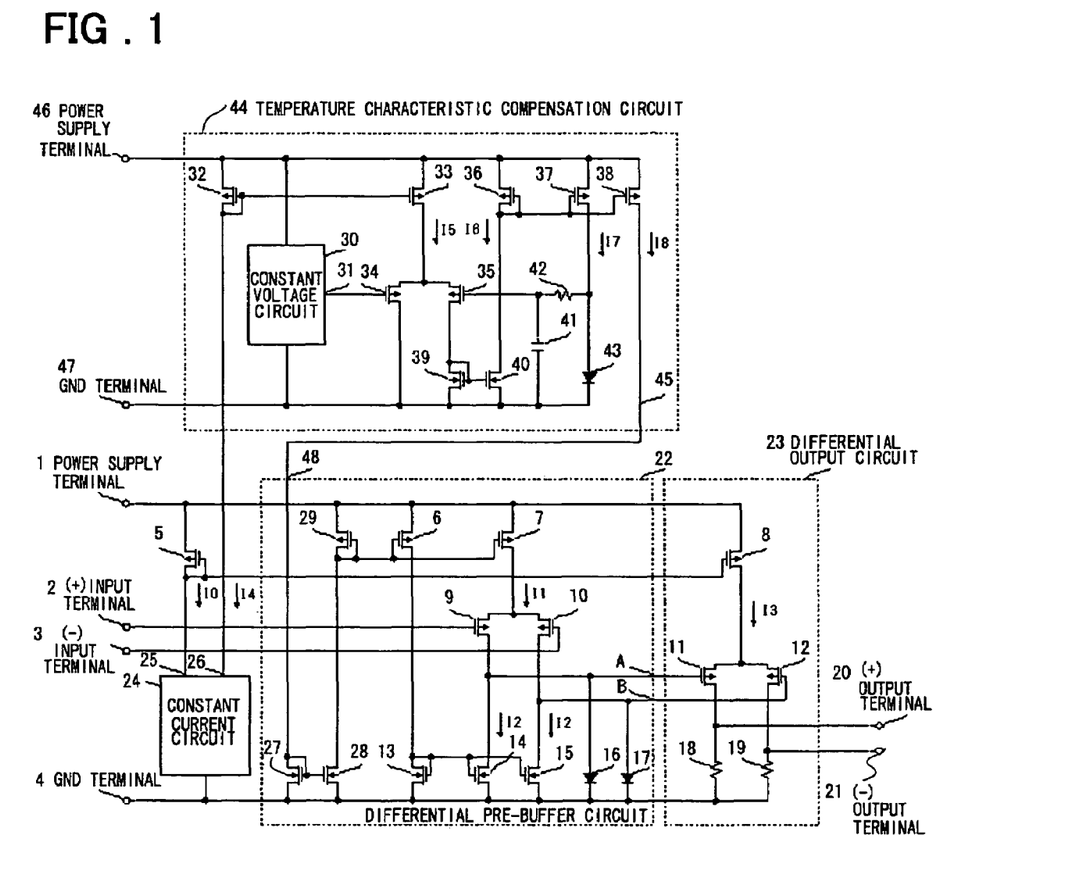
FIG. 1 is a circuit diagram of a driver circuit according to a first embodiment of the present invention.

A driver circuit according to an embodiment mode of the present invention includes a differential pre-buffer circuit (indicated by reference numeral 22 in FIG. 1) and a differential output circuit (indicated by reference numeral 23 in FIG. 1). In the differential pre-buffer circuit, signal clamping is performed by diodes (indicated by reference numerals 16 and 17 in FIG. 1) each having a nonlinear voltage-current characteristic with respect to an input signal. The differential output circuit amplifies output signals of the differential pre-buffer circuit, for output. The driver circuit further includes a temperature characteristic compensation circuit (indicated by reference numeral 44 in FIG. 1). The temperature characteristic compensation circuit controls direct currents to be passed through the diodes (indicated by reference numerals 16 and 17 in FIG. 1) based on a current to be passed through a diode (indicated by reference numeral 43 in FIG. 1) having a voltage-current characteristic with the same temperature coefficient as those of the diodes (indicated by reference numerals 16 and 17 in FIG. 1). According to the driver circuit of a configuration as described above, the current that cancels the temperature characteristic of a fall in forward voltages of the diodes (indicated by reference numerals 16 and 17 in FIG. 1) is supplied from the temperature characteristic compensation circuit (indicated by reference numeral 44 in FIG. 1). Accordingly, temperature compensation for an output waveform amplitude output from the differential buffer circuit (indicated by reference numeral 22 in FIG. 1) is performed, so that a fall in the amplitude at high temperature can be prevented. In conjunction with embodiments, a description will be given below in detail with reference to drawings.

First Embodiment

Figure 2:
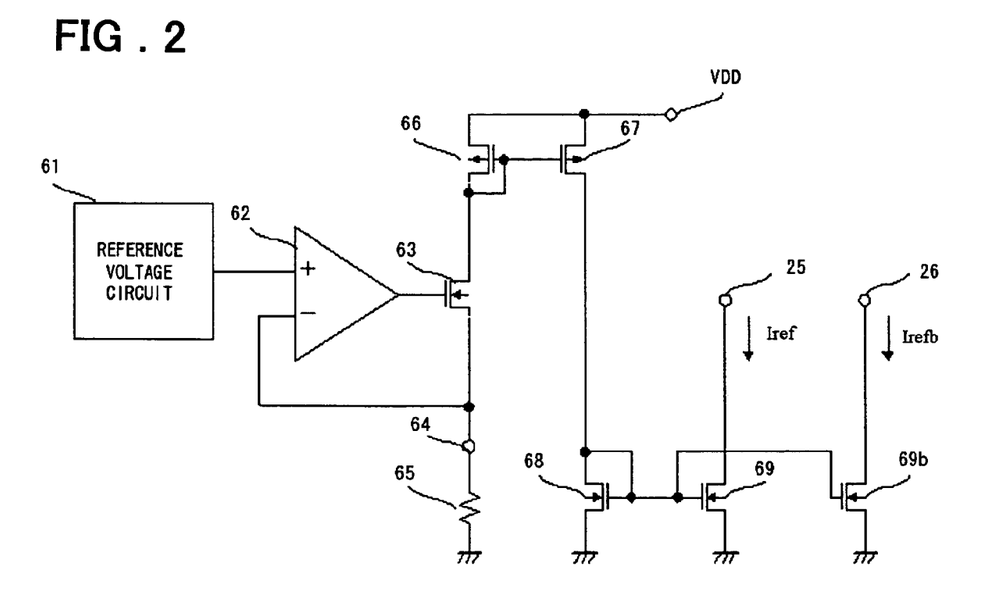
FIG. 2 is a circuit diagram of a constant current circuit.

FIG. 1 is a circuit diagram of a driver circuit according to a first embodiment of the present invention. The driver circuit in FIG. 1 is obtained by adding the temperature characteristic compensating circuit 44 to a driver circuit shown in FIG. 5. The differential pre-buffer circuit 22 is obtained by adding a constant current input terminal 48, N-ch MOS transistors 27 and 28 that constitute a current mirroring current mirror, and a P-ch MOS transistor 29 to a differential pre-buffer circuit 101 in FIG. 5. Further, gates of P-ch MOS transistors 6 and 7 are connected to a drain of a P-ch MOS transistor 29, thereby forming a current mirror. A constant current circuit 24 is a constant current circuit as shown in FIG. 2 and is obtained by adding an N-ch MOS transistor 69b and a current output terminal 26 to a constant current circuit 103 shown in FIG. 6. The differential output circuit 23 is the same as a differential output circuit 102. Since other components in FIG. 1 that have same reference numerals as those of FIG. 5 are identical ones, their descriptions will be omitted.

The current output terminal 26 of the constant current circuit 24 is connected to an input side of a current mirror constituted from P-ch MOS transistors 32 and 33 of the temperature characteristic compensation circuit 44, i.e., a drain and a gate of the P-ch MOS transistor 32 and a gate of the P-ch MOS transistor 33. A drain of the P-ch MOS transistor 33 at which an output of the current mirror appears is connected to sources of P-ch MOS transistors 34 and 35 constituting a differential amplifier. A drain of the P-ch MOS transistor 35 at which an output of the differential amplifier appears is connected to an input side of N-ch MOS transistors 39 and 40 that constitute a current mirror, i.e., a drain and a gate of the N-ch MOS transistor 39 and a gate of the N-ch MOS transistor 40. An output of the current mirror constituting the N-ch MOS transistors 39 and 40, i.e., a drain of the N-ch MOS transistor 40 is connected to an input side of a current mirror constituted from P-ch MOS transistors 36 to 38, i.e., a gate and a drain of the P-ch MOS transistor 36, a gate and a drain of the P-ch MOS transistor 37, and a gate of the P-ch MOS transistor 38. While the drain of the P-ch MOS transistor 37 is connected to an anode side of a diode 43, the drain of the P-ch MOS transistor 37 is connected to a gate of the P-ch MOS transistor 35 at which a differential inverted input of the differential amplifier appears, through a resistance 42. Incidentally, between the gate of the P-ch MOS transistor 35 and a GND terminal, a capacitor 41 for removing a high frequency component is connected. A drain of the P-ch MOs transistor 38 is connected to a constant current input terminal 48 of the differential pre-buffer circuit 22 through a constant current output terminal 45. A gate of the P-ch MOS transistor 34 that is a non-inverted input terminal of the differential amplifier is connected to an output terminal 31 of a constant voltage circuit 30. The constant voltage circuit 30 may be the same as a reference voltage circuit 61 contained in the constant current circuit shown in FIG. 2, or may also serve as the reference voltage circuit 61.

When a voltage at the output terminal 31 of the constant voltage circuit 30 is represented by Vref2 in the driver circuit configured as described above, the variations and the temperature variation of the voltage Vref2 can be reduced, as described in the conventional art. The P-ch MOS transistors 34 and 35 constitute the differential amplifier in which feedback is so performed that a forward voltage of the diode 43 is maintained to be constant by the voltage Vref2. A drain current I7 of the P-ch MOS transistor 37 in this case is expressed as follows:

$$I7 = Is \times \exp(q \times Vref2/k/T) \quad \text{Equation (5)}$$

When dimensions of the P-ch MfOS transistor 38 in the output stage of the temperature characteristic compensation circuit 44 are set to be the same as those of the P-ch MOS transistor 37 that supplies the current I7, an output current I8 of the temperature characteristic compensation circuit 44 is as follows:

$$I8 = I7 \quad \text{Equation (6)}$$

Further, when a mirror ratio from the N-ch MOS transistor 27, at which an input of the differential pre-buffer circuit 22 appears and which uses the output current I8 as a reference current, up to the P-ch MOS transistor 7 that constitutes a differential stage constant current source is set to M times, a mirror ratio from the N-ch MOS transistor 27 and up to P-ch MOS transistor 6 is set to N, and a mirror ratio of the N-ch MOS transistors 13 to 15 is set to unity (one), the following equations hold:

$$I1 = M \times I8 \quad \text{Equation (7)}$$

$$I2 = N \times I8 \quad \text{Equation (8)}$$

Then, a current with a current value of I1-I2 flows through the diode 16 or the diode 17. In other words, the current with the current value proportional to the value of the current that flows through the diode 43 will flow through the diode 16 or the diode 17.

Further, when respective emitter areas of the diodes 16 and 17 in the differential pre-buffer circuit 22 are set to be K times that of the diode 43 in the temperature characteristic compensation circuit 44, an output amplitude VF' of the differential pre-buffer circuit 22 becomes as follows by substituting Equations (7) and (8) into Equation (4):

$$VF' = (k \times T/q) \times \ln((M-N)I8/K/Is) \quad \text{Equation (9)}$$

The current I8 can be expressed using Equations (5) and (6), so that the output amplitude VF' becomes as follows:

$$VF' = (k \times T/q) \times \ln\{(M-N)/K\} + Vref2 \quad \text{Equation (10)}$$

The temperature characteristic of this output amplitude VF' becomes as follows by differentiation by the temperature T:

$$dVF'/dT = (k/q) \times \ln\{(M-N)/K\} \quad \text{Equation (11)}$$

When (M−N)/K is set to one in this case, dVF'/dT becomes zero. The temperature dependence of the output amplitude of the differential pre-buffer circuit 22 can be thereby minimized. Incidentally, it is preferred that the diodes 16 and 17 be arranged close to each other within a same chip so that the temperature characteristics of the diodes 16 and 17 match as much as possible.

As described above, when the temperature variation of the output amplitude of outputs A and B of the differential pre-buffer circuit 22 is small, the sufficient amplitude can be supplied to the P-ch MOS transistors 11 and 12 constituting the differential amplifier in the differential output circuit 23 even at a high temperature. Accordingly, the problem that an output amplitude of the output terminals 20 and 21 is reduced at the high temperature is solved. More specifically, an eye waveform at a high temperature shown in FIG. 9 becomes the eye waveform that is substantially the same as an eye waveform at the room temperature. Characteristics that sufficiently satisfy the opening specification can be obtained.

Second Embodiment

Figure 3:
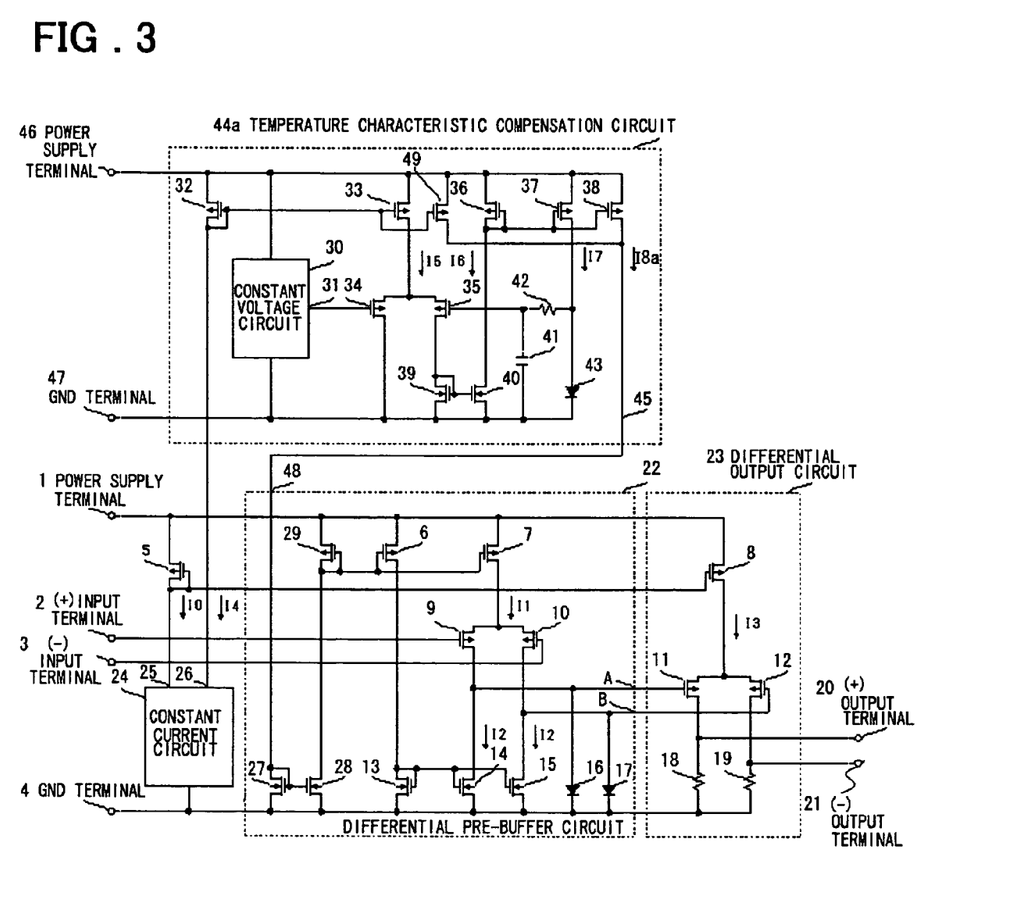
FIG. 3 is a circuit diagram of a driver circuit according to a second embodiment of the present invention.

FIG. 3 is a circuit diagram of a driver circuit according to a second embodiment of the present invention. Referring to the driver circuit in FIG. 3, a temperature characteristic compensation circuit 44a is different from the temperature characteristic compensation circuit 44 in FIG. 1 in that a P-ch MOS transistor 49 is added to the temperature characteristic compensation circuit 44 in FIG. 1. Except that, the temperature characteristic compensation circuit 44a is the same as the temperature characteristic compensation circuit 44 in FIG. 1. Thus, the description will be mainly directed to the P-ch MOS transistor 49. A gate of the P-ch MOS transistor 49 is connected to the gate of the P-ch MOS transistor 33. A drain of the P-ch transistor 49 provides an output of the current mirror of which the P-ch MOS transistor 32 serves as the input side. An output current from the drain of the P-ch MOS transistor 49 is a constant current of which the variations and the temperature variation are small. The drain of the P-ch MOS transistor 49 is connected to the drain of the P-ch MOS transistor 38 and is connected to the constant current output terminal 45. A drain current of the P-ch MOS transistor 49 is added to a drain current of the P-ch MOS transistor 38, and is output to the constant current input terminal 48 from the constant current output terminal 45 as an output current I8a.

In the driver circuit configured as described above, a current input to the temperature characteristic compensation circuit 44a is represented by I4, a mirror ratio between the P-ch MOS transistor 32 that servers as the input terminal of the temperature characteristic compensation circuit 44a and the P-ch MOS transistor 49 is represented by Z, the output current I8a from the temperature characteristic compensation circuit 44a is expressed as Equation (12) by addition of Z×I4 to Equation (5) and Equation (6).

$$I8a = Is \times \exp(q \times Vref2/k/T) + Z \times I4 \qquad \text{Equation (12)}$$

When the current I4 is zero, Equation (12) naturally becomes the same as Equation (6) into which Equation (5) has been substituted. When Z×I4 is extremely large, the following equation holds:

$$I8a = Z \times I4 \qquad \text{Equation (13)}$$

An output amplitude VF″ of the differential pre-buffer circuit 22 in this case has the temperature characteristic shown as follows, which is similar to that in the example of the conventional art.

$$VF'' = (k \times T/q) \times \ln\{(M-N) \times Z \times I4/K/Is\} \qquad \text{Equation (14)}$$

That is, by setting the mirror ratio Z as necessary, the temperature characteristic that is intermediate between the temperature characteristics of the first embodiment and the conventional art can be obtained. In this embodiment, by mixing a current for which temperature compensation is made with a current for which the temperature compensation is not performed and setting a mixing ratio appropriately, overcompensation by the temperature characteristic compensation circuit in the first embodiment can be corrected.

Third Embodiment

Figure 4:
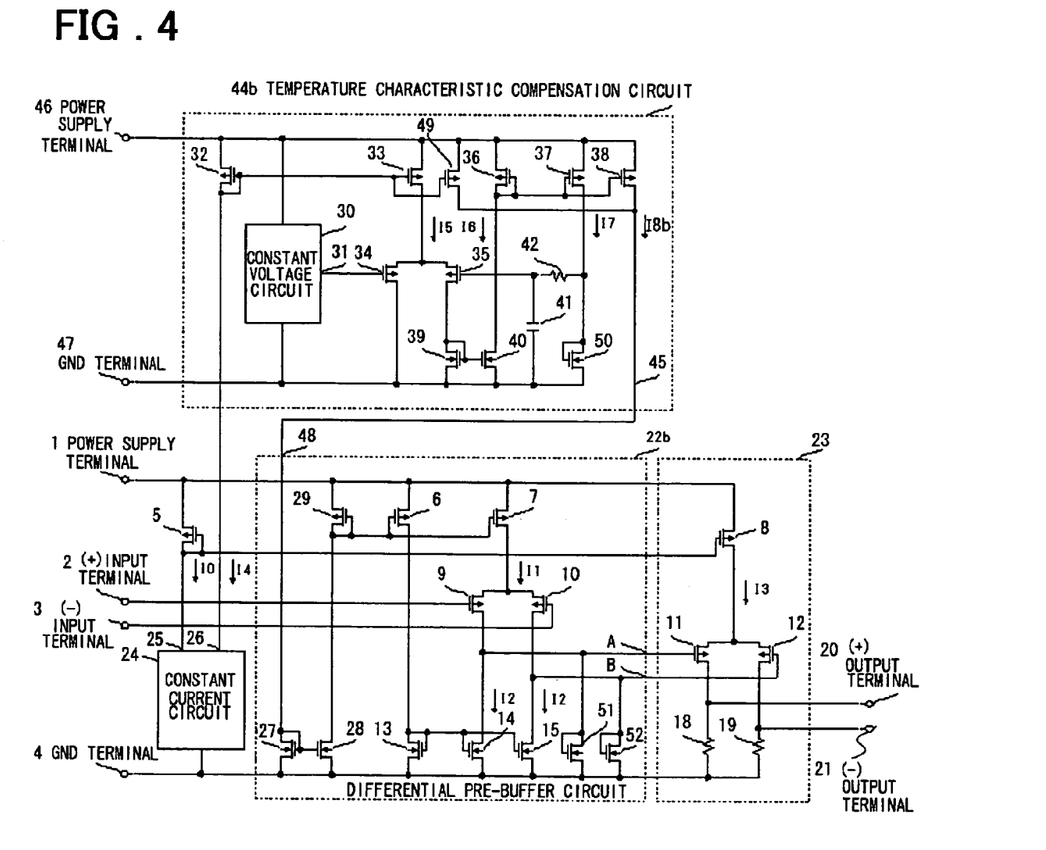
FIG. 4 is a circuit diagram of a driver circuit according to a third embodiment of the present invention.

FIG. 4 is a circuit diagram of a driver circuit according to a third embodiment of the present invention. In a differential pre-buffer circuit 22b and a temperature characteristic compensation circuit 44b in the driver circuit in FIG. 4, the diodes 16, 17 and 43 in FIG. 3 are replaced by N-ch MOS transistors 50, 51, and 52 each with a gate and a drain thereof connected to each other, respectively. Except that, the differential pre-buffer circuit 22b and the temperature characteristic compensation circuit 44b are the same as those in FIG. 3. Thus, their descriptions will be omitted, and the description will be mainly directed to the N-ch MOS transistors 50, 51, and 52.

Generally, when the gate length is represented by L, and the gate width is represented by W, there is the following relation between the gate-to-source voltage Vgs of an MOS transistor and the drain current Id:

$$Vgs = \{(2L/\beta/W)Id\}^{1/2} + Vt \qquad \text{Equation (15)}$$

in which $\beta = \mu s \times Cox$, $\mu s$ indicates a carrier mobility, Cox indicates a gate unit capacitance, and Vt indicates a threshold voltage.

The voltage Vgs when the current Id is made constant becomes a function of the temperature T. Then, Equation (15) is expressed as follows:

$$Vgs(T) = (2L/\beta(T)/W \times Id)^{1/2} + Vt(T) \qquad \text{Equation (16)}$$

As in Equation (12), the output current I8b of the temperature characteristic compensation circuit 44b becomes as follows:

$$I8b = \beta(T) \times W/2L \times (Vref2 - Vt(T))^2 + Z \times I4 \qquad \text{Equation (17)}$$

If the mirror ratio Z is set to zero, an output amplitude Vgs′ of the differential pre-buffer circuit 22 is as follows:

$$Vgs(T)' = \{(M-N)/K\}^{1/2} \times Vref2 + [1 - \{(M-N)/K\}^{1/2}] \times Vt(T)) \qquad \text{Equation (18)}$$

in which K indicates a ratio between W/L of the N-ch MOS transistor 50 and W/L of the N-ch MOS transistor 51 or 52.

When differentiation of Equation (18) by the temperature is performed, the following equation is obtained:

$$dVgs(T)'/dT = [1 - \{(M-N)/K\}^{1/2}] \times dVt(T)/dT \qquad \text{Equation (19)}$$

When (M−N)/K is set to unity as in the case of the first embodiment, the temperature dependence of the output amplitude Vgs′ of the differential pre-buffer circuit 22b can be minimized. Further, when the mirror ratio Z is adjusted, overcompensation is prevented, which is the same as in the second embodiment.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A driver circuit comprising:
    a buffer circuit that performs input signal clamping by first semiconductor devices each having a nonlinear voltage-current characteristic, for output; and
    a temperature compensation circuit that controls direct currents to be passed through said first semiconductor devices based on a direct current to be passed through a second semiconductor device, said second semiconductor device having a forward voltage maintained to be constant by a reference voltage, said second semiconductor device comprising a voltage-current characteristic with a same temperature coefficient as temperature coefficients of said first semiconductor devices, said temperature compensation circuit comprising:
        a first current mirror having an input connected to an output of a constant current circuit of said buffer circuit;
        a differential amplifier having an input connected to an output of said first current mirror;
        a second current mirror having an input connected to an output of said differential amplifier;
        a third current mirror having an input connected to an output of said second current mirror and an output connected to said second semiconductor device, an input of said buffer circuit, and said differential amplifier;
        a capacitor connected to said differential amplifier; and
        a constant voltage circuit having an output terminal connected to said differential amplifier, said constant voltage circuit for generating said reference voltage,
    wherein a direct current to be passed through said first semiconductor devices is controlled based on a direct current obtained by adding a predetermined current to the direct current to be passed through said second semiconductor device, the predetermined current depending other than on a temperature change.

2. The driver circuit according to claim 1, wherein the direct currents to be passed through said first semiconductor devices are controlled to be proportional to the direct current to be passed through said second semiconductor device.

3. The driver circuit according to claim 1, wherein the direct current to be passed through said second semiconductor device comprises the current that flows through said second semiconductor device when a predetermined voltage is supplied to said second semiconductor device, the predetermined voltage not depending on the temperature change.

4. The driver circuit according to claim 2, wherein the direct current to be passed through said second semiconductor device comprises the current that flows through said second semiconductor device when a predetermined voltage is supplied to said second semiconductor device, the predetermined voltage not depending on the temperature change.

5. The driver circuit according to claim 1, wherein said first and second semiconductor devices comprise diodes.

6. The driver circuit according to claim 2, wherein said first and second semiconductor devices comprise diodes.

7. The driver circuit according to claim 1, wherein said first and second semiconductor devices comprise MOS transistors each having a drain and a gate thereof connected to each other.

8. The driver circuit according to claim 2, wherein said first and second semiconductor devices comprise MOS transistors each having a drain and a gate thereof connected to each other.

9. The driver circuit according to claim 1, wherein said buffer circuit comprises a constant current circuit also for generating a reference current.

10. The driver circuit according to claim 9, wherein said constant current circuit includes a reference voltage circuit for generating a reference voltage.

11. The driver circuit according to claim 10, wherein said constant voltage circuit and said reference voltage circuit comprise the same circuit.

12. The driver circuit according to claim 1, wherein an amplitude of a current output from said buffer circuit is other than temperature dependent.

13. The driver circuit according to claim 2, wherein an amplitude of a current output from said buffer circuit is other than temperature dependent.

14. A temperature compensation circuit for a driver circuit having a buffer circuit that performs input signal clamping by first semiconductor devices each having a nonlinear voltage-current characteristic for output, said temperature compensation circuit comprising:
  a first current mirror having an input connected to an output of a constant current circuit of said buffer circuit;
  a differential amplifier having an input connected to an output of said first current mirror;
  a second current mirror having an input connected to an output of said differential amplifier;
  a third current mirror having a connection to said first current mirror, an input connected to an output of said second current mirror, and an output connected to a diode, an input of said buffer circuit, and said differential amplifier, said diode having a forward voltage maintained to constant by a reference voltage;
  a capacitor connected to said differential amplifier; and
  a constant voltage circuit having an output terminal connected to said differential amplifier, said constant voltage circuit for generating said reference voltage.

* * * * *